US012802600B2

(12) United States Patent
Yang et al.

(10) Patent No.: US 12,802,600 B2
(45) Date of Patent: Nov. 17, 2026

(54) DISPLAY DEVICE AND REPAIR METHOD THEREOF

(71) Applicant: LG Display Co., Ltd., Seoul (KR)

(72) Inventors: Kiyong Yang, Seoul (KR); KyuOh Kwon, Paju-si (KR); SeungJun Lee, Paju-si (KR); YongSeok Kwak, Goyang-si (KR); Il-Soo Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/359,238

(22) Filed: Oct. 15, 2025

(65) Prior Publication Data

US 2026/0188155 A1 Jul. 2, 2026

(30) Foreign Application Priority Data

Dec. 27, 2024 (KR) ........................ 10-2024-0198230

(51) Int. Cl.
*G09G 3/00* (2006.01)
*G09G 3/32* (2016.01)
(Continued)

(52) U.S. Cl.
CPC ............... *G09G 3/006* (2013.01); *G09G 3/32* (2013.01); *H10H 20/821* (2025.01); (Continued)

(58) Field of Classification Search
CPC .... G09G 3/006; G09G 3/32; G09G 2330/021; G09G 2330/08; G09G 2330/10; G09G 2330/12; H10H 20/821; H10H 29/32; H10H 29/39; H10H 29/41; H10H 29/49; H10H 29/8552
See application file for complete search history.

(56) References Cited

U.S. PATENT DOCUMENTS 11,444,066 B2 * 9/2022 Jung ...................... G09G 3/006
2015/0154933 A1 * 6/2015 Bae ...................... G09G 3/3611 345/618
(Continued)

FOREIGN PATENT DOCUMENTS

KR 2021-0017674 A 2/2021
KR 2023-0015384 A 1/2023

*Primary Examiner* — Amit Chatly
(74) *Attorney, Agent, or Firm* — Seed Intellectual Property Law Group LLP

(57) ABSTRACT

Disclosed are a display device and a repair method thereof. A display device includes a plurality of pixels, each pixel including a first sub pixel, a second sub pixel, a third sub pixel, and a repair sub pixel. A plurality of light emitting elements disposed in the first, second, and third sub pixels, and a repair light emitting element is disposed in the repair sub pixel of at least one pixel. The repair light emitting element includes a first repair light emitting element, a second repair light emitting element, and a third repair light emitting element, each having a different shape. By configuring the shapes of the plurality of repair light emitting elements differently, the plurality of repair light emitting elements can be transferred to the same position within the repair sub pixel while connecting to different electrodes, reducing the repair sub pixel area and enabling high resolution display performance.

15 Claims, 11 Drawing Sheets

(51) Int. Cl.

*H10H 20/821* (2025.01)
*H10H 29/32* (2025.01)
*H10H 29/39* (2025.01)
*H10H 29/41* (2025.01)
*H10H 29/49* (2025.01)
*H10H 29/855* (2025.01)

(52) U.S. Cl.

CPC ............ *H10H 29/32* (2025.01); *H10H 29/39* (2025.01); *H10H 29/41* (2025.01); *H10H 29/49* (2025.01); *H10H 29/8552* (2025.01); *G09G 2330/021* (2013.01); *G09G 2330/08* (2013.01); *G09G 2330/10* (2013.01); *G09G 2330/12* (2013.01)

(56) References Cited

U.S. PATENT DOCUMENTS

| | | | | |
|---|---|---|---|---|
| 2023/0275200 | A1* | 8/2023 | Lee | H10D 86/441 257/72 |
| 2024/0258281 | A1* | 8/2024 | Lee | H10H 20/018 |

* cited by examiner

DISPLAY DEVICE AND REPAIR METHOD THEREOF

CROSS-REFERENCE TO RELATED APPLICATIONS

This application claims the priority of Korean Patent Application No. 10-2024-0198230 filed on Dec. 27, 2024, in the Korean Intellectual Property Office, the disclosure of which is incorporated herein by reference.

BACKGROUND

Technical Field

The present disclosure relates to a display device, and more particularly, to a display device using a light emitting element (LED).

Description of the Related Art

Display devices used in computer monitors, televisions, and mobile phones include an organic light emitting display (OLED) device that emits light by itself, and a liquid crystal display (LCD) device that requires a separate light source.

The application range of display devices has been expanding not only to computer monitors and televisions but also to personal portable devices, and research is underway on display devices having a large display area while being reduced in volume and weight.

In addition, recently, display devices including inorganic light emitting elements have attracted attention as next-generation display devices. Since inorganic light emitting elements are composed of inorganic materials rather than organic materials, they have excellent reliability and a longer lifespan compared to liquid crystal display devices or organic light emitting display devices. In addition, inorganic light emitting elements not only have fast lighting speed, but also excellent luminous efficiency, high impact resistance providing superior stability, and the ability to display high-brightness images.

BRIEF SUMMARY

The present disclosure describes a compact repair sub pixel architecture for high resolution display devices using inorganic LEDs. Instead of dedicating separate repair areas for each color sub pixel (red, green, blue), a single repair sub pixel accommodates differently shaped repair light emitting elements ('⌉', 'I', '⌈'), each designed to connect with the appropriate defective sub pixel through shared electrodes. This arrangement reduces the repair sub pixel area, allowing for smaller pixels, higher resolution, and greater design flexibility without limiting repair capability.

The structure includes shared first and second connection electrodes extending from all sub pixels into the repair sub pixel along with a conductive adhesive layer that conducts only where pressure or heat is applied. The different shapes of the repair elements allow all potential repair sites to occupy the same physical area while maintaining electrical isolation and preventing shorts, resulting in a simplified repair layout and process.

The use of flip chip repair LEDs together with lateral type main LEDs further improves manufacturability by enabling efficient transfer, bonding, and electrical connection when defects occur. These features provide a display device with reduced power consumption, long operating life, effective repairability, and enhanced image quality compared to conventional designs.

Various embodiments of the present disclosure provide a display device that can be driven at low power consumption by including an inorganic light emitting element having excellent luminous efficiency.

According to the present disclosure, since the position of a repair sub pixel may be formed regardless of the color of the light emitting element to be repaired, it is possible to reduce additional transfer processes caused by positional differences of light emitting elements.

Various embodiments of the present disclosure provide a display device in which the area of a repair sub pixel is reduced.

Various embodiments of the present disclosure provide a display device capable of implementing high resolution by reducing the size of pixels.

Various embodiments of the present disclosure provide a display device in which design flexibility is improved by modifying the shape of the light emitting element corresponding to the shape of a repair sub pixel.

Technical benefits of the present disclosure are not limited to the above-mentioned benefits, and other benefits, which are not mentioned above, can be clearly understood by those skilled in the art from the following descriptions.

A display device according to an exemplary embodiment of the present disclosure includes a substrate on which a plurality of pixels is formed, each pixel including a first sub pixel, a second sub pixel, a third sub pixel, and a repair sub pixel; a first light emitting element disposed in the first sub pixel; a second light emitting element disposed in the second sub pixel; a third light emitting element disposed in the third sub pixel; and a repair light emitting element disposed in the repair sub pixel of at least any one of the plurality of pixels, in which the repair light emitting element includes a first repair light emitting element, a second repair light emitting element, and a third repair light emitting element having different shapes from each other, and in which only one of the first repair light emitting element, the second repair light emitting element, and the third repair light emitting element is disposed in one repair sub pixel. Accordingly, by configuring the shapes of the plurality of repair light emitting elements differently, each of the plurality of repair light emitting elements transferred to the same position of the repair sub pixel may be connected to a different electrode, and the area of the repair sub pixel may be minimized.

Other detailed matters of the exemplary embodiments are included in the detailed description and the drawings.

According to the present disclosure, it is possible to implement a high-resolution display device capable of displaying high-efficiency and high-luminance images with low power consumption by including an inorganic light emitting element having excellent luminous efficiency.

According to the present disclosure, the area of a repair sub pixel may be reduced.

According to the present disclosure, it is possible to provide a display device capable of displaying high-resolution images by reducing the size of pixels.

According to the present disclosure, design flexibility of the display device may be improved by modifying the shape of a light emitting element corresponding to the shape of a repair sub pixel.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
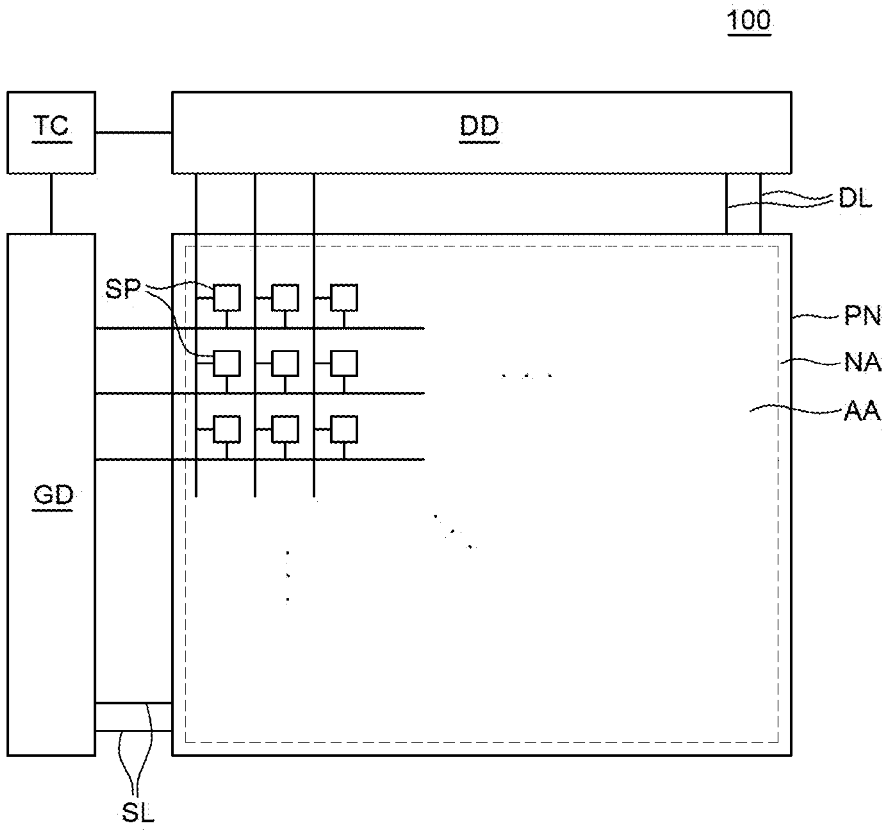
FIG. 1 is a schematic configuration diagram of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

As used herein, the term "connected" is intended to have the broadest possible meaning. Specifically, the phrase "A is connected to B" encompasses both a direct connection—where no intervening components or elements are present—and an indirect connection, where one or more intermediate components or elements exist between A and B. In other words, "A is connected to B" includes both direct physical or electrical coupling and indirect coupling through one or more intervening components. Unless explicitly stated otherwise, these terms do not require direct physical or electrical contact. The term "coupled" and "in contact" should be interpreted in the same manner.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The phrase "A filled in B" does not imply that A is exclusively contained within B to the exclusion of other materials. Instead, it is intended to encompass a broad range of conditions, including but not limited to "partially filled in," "substantially filled in," "completely filled in," and "exclusively filled in." Similarly, the phrase "B filled with A" does not suggest that B is exclusively filled with A, excluding other materials. Rather, it covers various degrees of filling, such as "partially filled with," "substantially filled with," "completely filled with," and "exclusively filled with."

As used herein, the term "lateral type light emitting element" refers to a light emitting device in which the first and second electrodes (e.g., n-type and p-type electrodes) are disposed on the same principal surface of the semiconductor layers of the light emitting element. In a lateral type configuration, current flows laterally across the device between the electrodes on the same side, and light is typically extracted from the opposite side or through the same side, depending on the device structure. This term is intended to encompass conventional lateral LEDs known in the art as well as equivalent structures performing the same function.

As used herein, the term "flip-chip type light emitting element" refers to a light emitting device in which the first and second electrodes are disposed on a surface of the semiconductor layers facing the mounting substrate such that the light emitting surface of the device is oriented opposite the substrate after mounting. In a flip-chip configuration, the device is typically mounted upside down (flipped) so that light is extracted from the top side, opposite the electrodes, and the electrodes are in direct contact with the substrate or interconnect pads. This term is intended to encompass conventional flip-chip LEDs known in the art as well as equivalent structures performing the same function.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a schematic configuration diagram of a display device according to an exemplary embodiment of the present disclosure. For convenience of explanation, FIG. 1 illustrates only a display panel PN, a gate driver GD, a data driver DD, and a timing controller TC among various components of the display device.

Referring to FIG. 1, the display device according to an exemplary embodiment of the present disclosure includes the display panel PN including a plurality of sub pixels, the gate driver GD and the data driver DD that supply various signals to the display panel PN, and the timing controller TC that controls the gate driver GD and the data driver DD.

The gate driver GD supplies a plurality of scan signals to a plurality of scan lines SL according to a plurality of gate control signals provided from the timing controller TC. In FIG. 1, one gate driver GD is illustrated as being disposed apart from one side of the display panel PN, but the number and arrangement of the gate drivers GD are not limited thereto.

The data driver DD supplies data voltages to a plurality of data lines DL according to a plurality of data control signals and image data provided from the timing controller TC. The data driver DD may convert the image data into the data voltages using reference gamma voltages and supply the converted data voltages to the plurality of data lines DL.

The timing controller TC aligns image data input from the outside and supplies it to the data driver DD. The timing controller TC may generate a gate control signal and a data control signal by using synchronization signals input from the outside, for example, a dot clock signal, a data enable signal, and a horizontal/vertical synchronization signal. The timing controller TC may supply the generated gate control signal and data control signal to the gate driver GD and the data driver DD, respectively, to control the gate driver GD and the data driver DD.

The display panel PN is a configuration for displaying an image to a user and includes a plurality of sub pixels. In the display panel PN, a plurality of scan lines SL and a plurality of data lines DL intersect each other, and a plurality of sub pixels may be formed at intersections of the scan lines SL and the data lines DL.

An active area AA and a non-active area NA may be defined in the display panel PN.

The active area AA is an area in which an image is displayed in the display device. In the active area AA, a plurality of sub pixels and pixel circuits for driving the plurality of sub pixels may be disposed. The plurality of sub pixels are minimum units constituting the active area AA, and each of the plurality of sub pixels includes a light emitting element and may independently emit light. The plurality of sub pixels may include red sub pixels, green sub pixels, and blue sub pixels, and thus display images of various colors. The types of the plurality of sub pixels are merely exemplary, but the exemplary embodiments of the present disclosure are not limited thereto.

In the active area AA, a plurality of signal lines for transmitting various signals to the plurality of sub pixels is disposed. For example, the plurality of signal lines may include a plurality of data lines DL for supplying data voltages to each of the plurality of sub pixels and a plurality of scan lines SL for supplying scan signals to each of the plurality of sub pixels. The plurality of scan lines SL may extend in one direction in the active area AA and be connected to the plurality of sub pixels, and the plurality of data lines DL may extend in a direction different from the one direction in the active area AA and be connected to the plurality of sub pixels. In addition, the active area AA may further include a low-potential power line, a high-potential power line, and the like, but is not limited thereto.

The non-active area NA may be defined as an area in which an image is not displayed and which extends from the active area AA. In the non-active area NA, link lines for transmitting signals to the sub pixels of the active area AA and pad electrodes, or driving ICs such as a gate driver IC and a data driver IC may be disposed.

Meanwhile, the non-active area NA may be located on the rear surface of the display panel PN, that is, on the surface without sub pixels, or may be omitted, and is not limited to the example illustrated in the drawings.

Hereinafter, with reference to FIGS. 2 and 3, the sub pixels of the display panel PN of the display device according to an exemplary embodiment of the present disclosure will be described in more detail.

Figure 2:
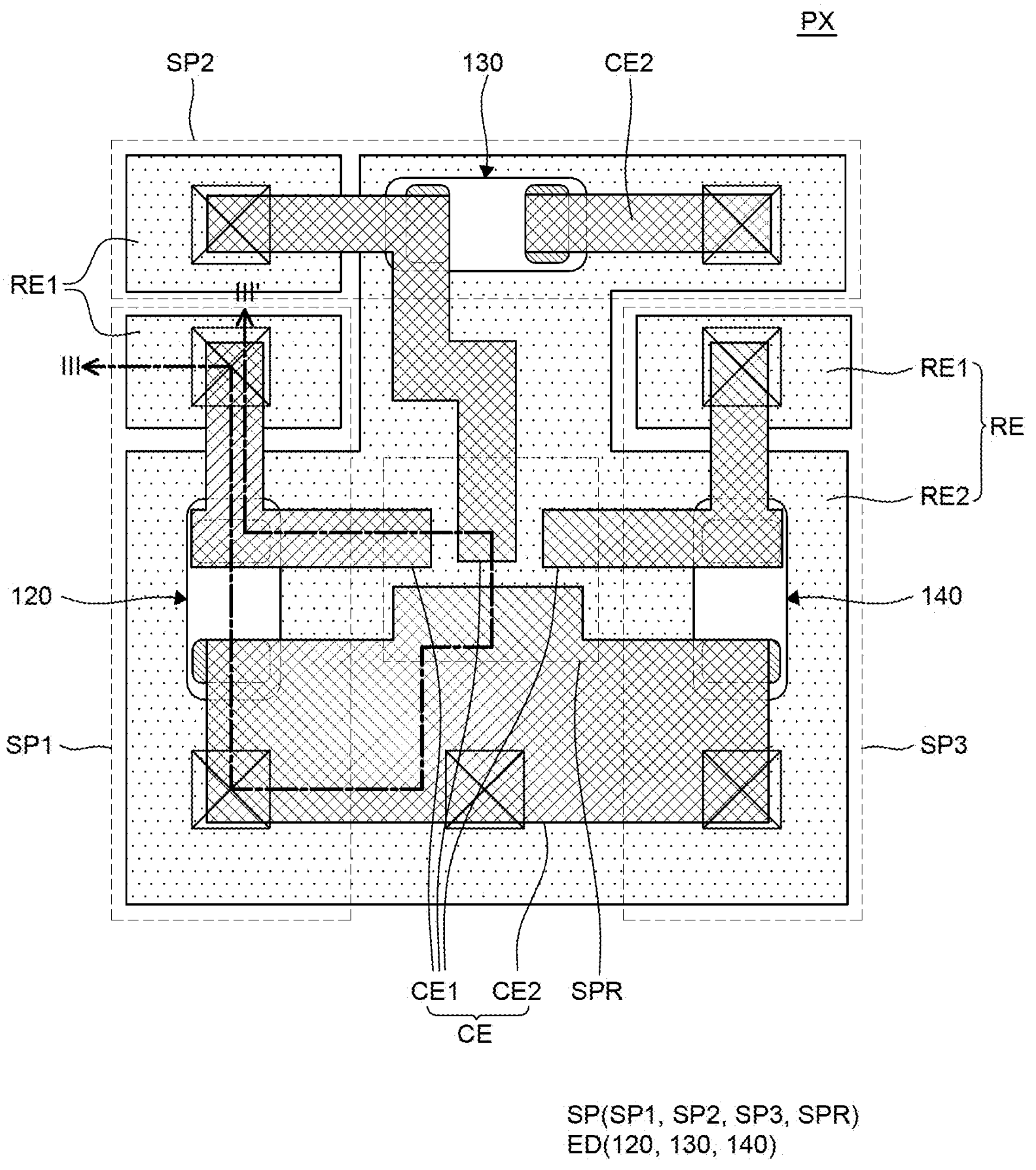
FIG. 2 is a plan view of a pixel of a display device according to an exemplary embodiment of the present disclosure.

FIG. 2 is a plan view of a pixel of a display device according to an exemplary embodiment of the present disclosure. FIG. 3 is a cross-sectional view taken along line III-III' of FIG. 2.

Referring to FIG. 2, a pixel PX includes a plurality of sub pixels SP. For example, one pixel PX includes a first sub pixel SP1, a second sub pixel SP2, a third sub pixel SP3, and a repair sub pixel SPR. For example, the first sub pixel SP1, the second sub pixel SP2, and the third sub pixel SP3 may be a red sub pixel, a green sub pixel, and a blue sub pixel, respectively. For example, the repair sub pixel SPR is an additional sub pixel SP in which a repair light emitting element EDR is transferred when any one of the first sub pixel SP1, the second sub pixel SP2, and the third sub pixel SP3 is defective. The first sub pixel SP1, the second sub pixel SP2, and the third sub pixel SP3 may be disposed along the periphery of the repair sub pixel SPR.

Figure 3:
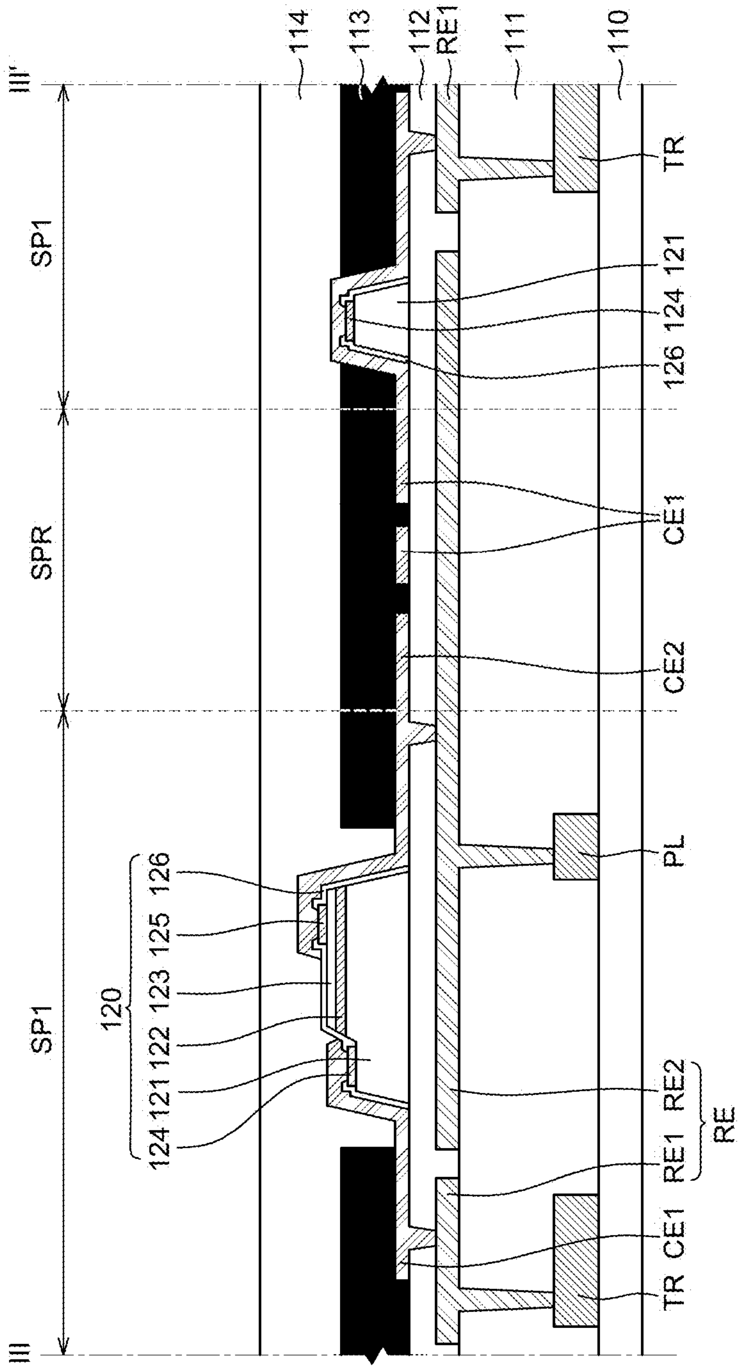
FIG. 3 is a cross-sectional view taken along line III-III' of FIG. 2.

Referring to FIGS. 2 and 3, a substrate 110 is a member that supports other components of the display device 100, and may be an insulating substrate 110. For example, the substrate 110 may be formed of glass or resin. In addition, the substrate 110 may be formed of a polymer or plastic, and in some exemplary embodiments, the substrate 110 may be formed of a plastic material having flexibility.

On the substrate 110, a pixel circuit including a driving transistor TR is disposed in each of the first sub pixel SP1, the second sub pixel SP2, and the third sub pixel SP3. The driving transistor TR may control a driving current applied to the light emitting element ED and the repair light emitting element EDR (shown in FIGS. 5A-5C). The driving transistor TR may be a thin film transistor (TFT), an N-channel metal oxide semiconductor (NMOS), a P-channel metal oxide semiconductor (PMOS), a complementary metal oxide semiconductor (CMOS), a field effect transistor (FET), or the like, but the exemplary embodiments of the present disclosure are not limited thereto.

Meanwhile, the pixel circuit may further include a switching transistor, a sensing transistor, a light emitting control transistor, and a storage capacitor in addition to the driving transistor TR.

A power line PL is disposed on the substrate 110. The power line PL may be configured to transmit a power voltage to the light emitting elements ED of the plurality of sub pixels SP. The power line PL may be formed of a conductive material, and for example, may be formed of copper (Cu), aluminum (Al), molybdenum (Mo), nickel (Ni), titanium (Ti), chromium (Cr), or an alloy thereof, but the exemplary embodiments of the present disclosure are not limited thereto. The power line PL may be configured as any one of a low-potential power line PL or a high-potential power line PL, depending on the configuration of the pixel circuit.

An insulating layer 111 is disposed on the substrate 110. The insulating layer 111 may include one or more insulating films, and for example, the insulating layer 111 may include one or more of a buffer layer, a gate insulating layer, an interlayer insulating layer, a passivation layer, a planarization layer, and the like. The insulating layer 111 may include an inorganic insulating film and/or an organic insulating film. The insulating layer 111 is disposed above the driving transistor TR and the power line PL so as to protect them and to insulate some components. The configuration of the insulating layer 111 may vary depending on the design of the display device 100 and the configuration of the pixel circuit.

On the insulating layer 111, a first reflective electrode RE1 is disposed in each of the first sub pixel SP1, the second sub pixel SP2, and the third sub pixel SP3. The first reflective electrode RE1 is an electrode for electrically connecting the light emitting element ED and the driving transistor TR.

On the insulating layer 111, a second reflective electrode RE2 is disposed in each of the first sub pixel SP1, the second sub pixel SP2, the third sub pixel SP3, and the repair sub pixel SPR. The second reflective electrode RE2 is an electrode for electrically connecting the light emitting element ED and the repair light emitting element EDR with the power line PL. Since the second reflective electrode RE2 is a common electrode that commonly connects the power line PL to the light emitting element ED and the repair light emitting element EDR, the second reflective electrodes RE2 of each of the plurality of sub pixels SP may be connected to each other to form a single electrode. In addition, the second reflective electrode RE2 overlaps the light emitting element ED and the repair light emitting element EDR so as to reflect light emitted from the light emitting element ED and the repair light emitting element EDR toward the upper portion of the substrate 110.

The plurality of first reflective electrodes RE1 and second reflective electrodes RE2 may include various conductive layers in consideration of light reflection efficiency and resistance. For example, the first reflective electrode RE1 and the second reflective electrode RE2 may include an opaque conductive layer such as silver (Ag), aluminum (Al), molybdenum (Mo), titanium (Ti), or an alloy thereof, and a transparent conductive layer such as indium tin oxide (ITO), but the configurations of the first reflective electrode RE1 and the second reflective electrode RE2 are not limited thereto.

An adhesive layer 112 is disposed on the plurality of first reflective electrodes RE1 and second reflective electrodes RE2. The adhesive layer 112 is formed on the entire surface of the substrate 110 and may fix the light emitting element ED disposed on the adhesive layer 112. The adhesive layer 112 may be made of a photocurable adhesive material that may be cured by light. For example, the adhesive layer 112 may be selected from any one of an adhesive polymer, an epoxy resist, a UV resin, a polyimide-based material, an acrylate-based material, a urethane-based material, and polydimethylsiloxane (PDMS), but the exemplary embodiments of the present disclosure are not limited thereto.

Light emitting elements ED are disposed on the adhesive layer 112 in each of the first sub pixel SP1, the second sub pixel SP2, and the third sub pixel SP3. The light emitting element ED may be any one of a light emitting diode LED or a micro light emitting diode micro LED, but the exemplary embodiments of the present disclosure are not limited thereto. The light emitting element ED may be fixed on the adhesive layer 112.

The light emitting element ED includes a first light emitting element 120, a second light emitting element 130, and a third light emitting element 140. The first light emitting element 120 is disposed in the first sub pixel SP1, the second light emitting element 130 is disposed in the second sub pixel SP2, and the third light emitting element 140 is disposed in the third sub pixel SP3. Each of the first light emitting element 120, the second light emitting element 130, and the third light emitting element 140 may be a red light emitting element ED, a green light emitting element ED, and a blue light emitting element ED, respectively.

Hereinafter, it will be described that each of the first light emitting element 120, the second light emitting element 130, and the third light emitting element 140 is a lateral type LED, but the exemplary embodiments of the present disclosure are not limited thereto.

For example, referring to FIG. 3, the first light emitting element 120 is disposed on the adhesive layer 112 in a first sub pixel SP1. The first light emitting element 120 includes a first n-type semiconductor layer 121, a first light emitting layer 122, a first p-type semiconductor layer 123, a first n-type electrode 124, a first p-type electrode 125, and a first protective film 126.

The first n-type semiconductor layer 121 is disposed on the adhesive layer 112, and the first p-type semiconductor layer 123 is disposed above the first n-type semiconductor layer 121. The first n-type semiconductor layer 121 may be a semiconductor layer doped with an n-type impurity, and the first p-type semiconductor layer 123 may be a semiconductor layer doped with a p-type impurity. For example, the first n-type semiconductor layer 121 and the first p-type semiconductor layer 123 may be layers doped with n-type or p-type impurities in materials such as gallium nitride (GaN), indium aluminum phosphide (InAlP), and gallium arsenide (GaAs). The p-type impurity may include magnesium, zinc (Zn), and beryllium (Be), and the n-type impurity may include silicon (Si), germanium (Ge), and tin (Sn), but the exemplary embodiments of the present disclosure are not limited thereto.

A first light emitting layer 122 is disposed between the first n-type semiconductor layer 121 and the first p-type semiconductor layer 123. The first light emitting layer 122 may emit light based on a driving current. For example, the first light emitting layer 122 may have a single layer or a multi-quantum well (MQW) structure, and may be made of indium gallium nitride (InGaN) or gallium nitride (GaN), but the exemplary embodiments of the present disclosure are not limited thereto.

The first n-type electrode 124 is disposed on the first n-type semiconductor layer 121, and the first p-type electrode 125 is disposed on the first p-type semiconductor layer 123. The first n-type electrode 124 is an electrode for electrically connecting the first light emitting element 120 to a first connection electrode CE1, a first reflective electrode RE1, and a driving transistor TR. The first p-type electrode 125 is an electrode for electrically connecting the first light emitting element 120 to a second connection electrode CE2, a second reflective electrode RE2, and the power line PL.

The first electrode may include an opaque conductive material having excellent reflectance efficiency, and may reflect light emitted from the light emitting layer toward an upper portion of the substrate 110. For example, the first n-type electrode 124 may include an opaque conductive material such as titanium (Ti), gold (Au), silver (Ag), copper (Cu), or alloys thereof, but the exemplary embodiments of the present disclosure are not limited thereto. In addition, the first n-type electrode 124 may further include a transparent conductive material such as indium tin oxide (ITO) or indium zinc oxide (IZO), but the exemplary embodiments of the present disclosure are not limited thereto. For example, first p-type electrode 125 may be formed of a transparent conductive material such as indium tin oxide (ITO) or indium zinc oxide (IZO), but the exemplary embodiments of the present disclosure are not limited thereto.

The first protective film 126 which encloses the first n-type semiconductor layer 121, the first light emitting layer 122, and the first p-type semiconductor layer 123 is disposed. The first protective film 126 may be an insulating film that protects the first n-type semiconductor layer 121, the first light emitting layer 122, and the first p-type semiconductor layer 123. The first protective film 126 may cover side surfaces of the first n-type semiconductor layer 121, side surfaces of the first light emitting layer 122, side and top surfaces of the first p-type semiconductor layer 123, and edges of the first n-type electrode 124 and the first p-type electrode 125. For example, the first protective film 126 may be formed of an insulating material such as silicon oxide (SiOx) or silicon nitride (SiNx), but the exemplary embodiments of the present disclosure are not limited thereto.

Meanwhile, the second light emitting element 130 and the third light emitting element 140 may have substantially the same configuration and structure as the first light emitting element 120, but the exemplary embodiments of the present disclosure are not limited thereto, and the second light emitting element 130 and the third light emitting element 140 may have different planar structures from the first light emitting element 120. For example, the second light emitting element 130 may be a lateral type chip including a second n-type semiconductor layer 131, a second light emitting layer 132, a second p-type semiconductor layer 133, a second n-type electrode 134, a second p-type electrode 135, and a second protective film, and the third light emitting element 140 may also be a lateral type chip including a third n-type semiconductor layer 141, a third light emitting layer 142, a third p-type semiconductor layer 143, a third n-type electrode 144, a third p-type electrode 145, and a third protective film.

Next, a first connection electrode CE1 and a second connection electrode CE2 are disposed on the plurality of light emitting elements ED. The first connection electrode CE1 is an electrode that electrically connects the light emitting element ED and the first reflective electrode RE1, and the second connection electrode CE2 is an electrode that electrically connects the light emitting element ED and the second reflective electrode RE2. For example, the first connection electrode CE1 may connect the n-type electrode and the first reflective electrode RE1, and the second connection electrode CE2 may connect the p-type electrode and the second reflective electrode RE2.

At this time, since the second connection electrodes CE2 of each of the plurality of sub pixels SP are commonly electrically connected to the power line PL, the second connection electrodes CE2 of at least some of the plurality of sub pixels SP may be connected to each other. For example, the second connection electrodes CE2 of the first sub pixel SP1 and the third sub pixel SP3 may be connected to each other.

Meanwhile, in preparation for a repair process, the first connection electrode CE1 and the second connection electrode CE2 may be disposed in the repair sub pixel SPR. The repair light emitting element EDR may be in contact with any one of the first connection electrodes CE1 of the plurality of sub pixels SP and may be electrically connected to the driving transistor TR of any one of the plurality of sub pixels SP. In addition, the repair light emitting element EDR may be in contact with at least any one of the second connection electrodes CE2 of the plurality of sub pixels SP and may be electrically connected to the power line PL.

For example, each of a first connection electrode CE1 of a first sub pixel SP1, a first connection electrode CE1 of a second sub pixel SP2, and a first connection electrode CE1 of a third sub pixel SP3 may extend to the repair sub pixel SPR. A repair light emitting element EDR may contact the first connection electrode CE1 of a defective sub pixel SP among the first sub pixel SP1, the second sub pixel SP2, and the third sub pixel SP3.

For example, at least any one of a second connection electrode CE2 of the first sub pixel SP1, a second connection electrode CE2 of the second sub pixel SP2, and a second connection electrode CE2 of the third sub pixel SP3 may extend to the repair sub pixel SPR. Since the second connection electrode CE2 is commonly connected to the power line PL, at least any one of the second connection electrodes CE2 of a plurality of sub pixels SP may extend to the repair sub pixel SPR so that the repair light emitting element EDR and the power line PL may be electrically connected. For example, the second connection electrode CE2 of the first sub pixel SP1 and the second connection electrode CE2 of the third sub pixel SP3 may extend to the repair sub pixel SPR and be connected to each other.

The first connection electrode CE1 and the second connection electrode CE2 may be formed of a transparent conductive material such as indium tin oxide (ITO) or indium zinc oxide (IZO), but the exemplary embodiments of the present disclosure are not limited thereto.

A black matrix 113 is disposed on the first connection electrode CE1, the second connection electrode CE2, and a plurality of light emitting elements ED. The black matrix 113 may be disposed on an entire surface of a substrate 110. The black matrix 113 includes openings overlapping the plurality of light emitting elements ED so that light emitted from the light emitting element ED may be directed outside the display device 100. The black matrix 113 may shield light of each of the plurality of sub pixels SP so as not to be mixed with one another. In addition, the black matrix 113 may absorb light incident from the outside toward the display device 100, thereby minimizing a decrease in visibility caused by reflection inside the display device 100. For example, the black matrix 113 includes a black component and may be formed of an opaque resin containing a pigment, but is not limited thereto.

A protective layer 114 is disposed on the black matrix 113. The protective layer 114 is a layer for protecting the configuration under the protective layer 114, and may suppress permeation of moisture or oxygen from the outside. For example, the protective layer 114 may be configured as a single layer or a multi-layer, and for example, an epoxy-based polymer or an acryl-based polymer may be used, but the exemplary embodiments of the present disclosure are not limited thereto.

Meanwhile, the display device 100 according to an exemplary embodiment of the present disclosure includes the repair sub pixel SPR, and when a defective sub pixel SP occurs, a repair light emitting element EDR may be additionally transferred to the repair sub pixel SPR to compensate for the defective sub pixel SP.

Hereinafter, with reference to FIGS. 4A to 6, a method of repairing a defective sub pixel SP will be described.

Figure 5A:
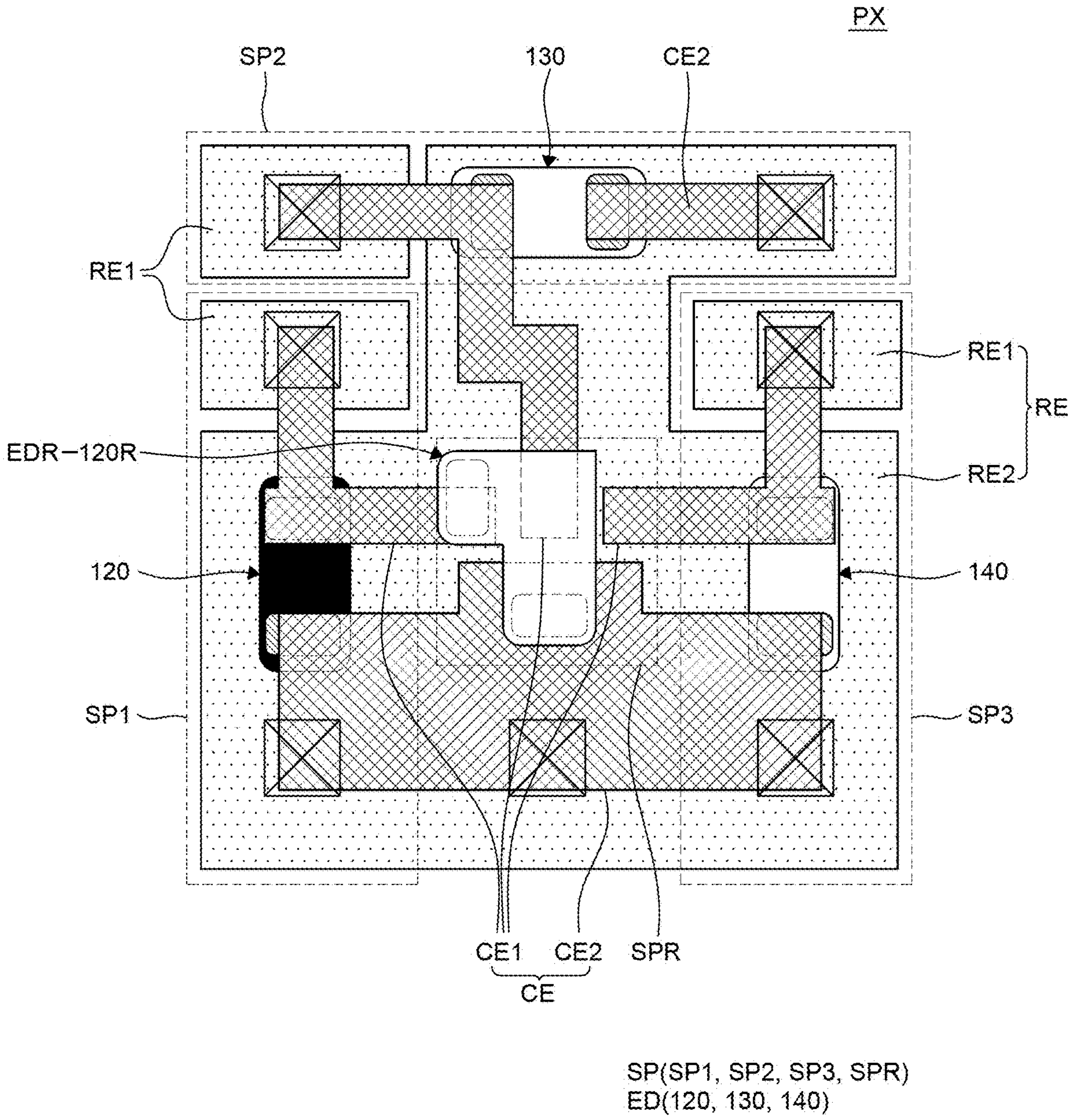
FIGS. 5A to 5C are plan views of a pixel of a display device according to an exemplary embodiment of the present disclosure.
Figure 5B:
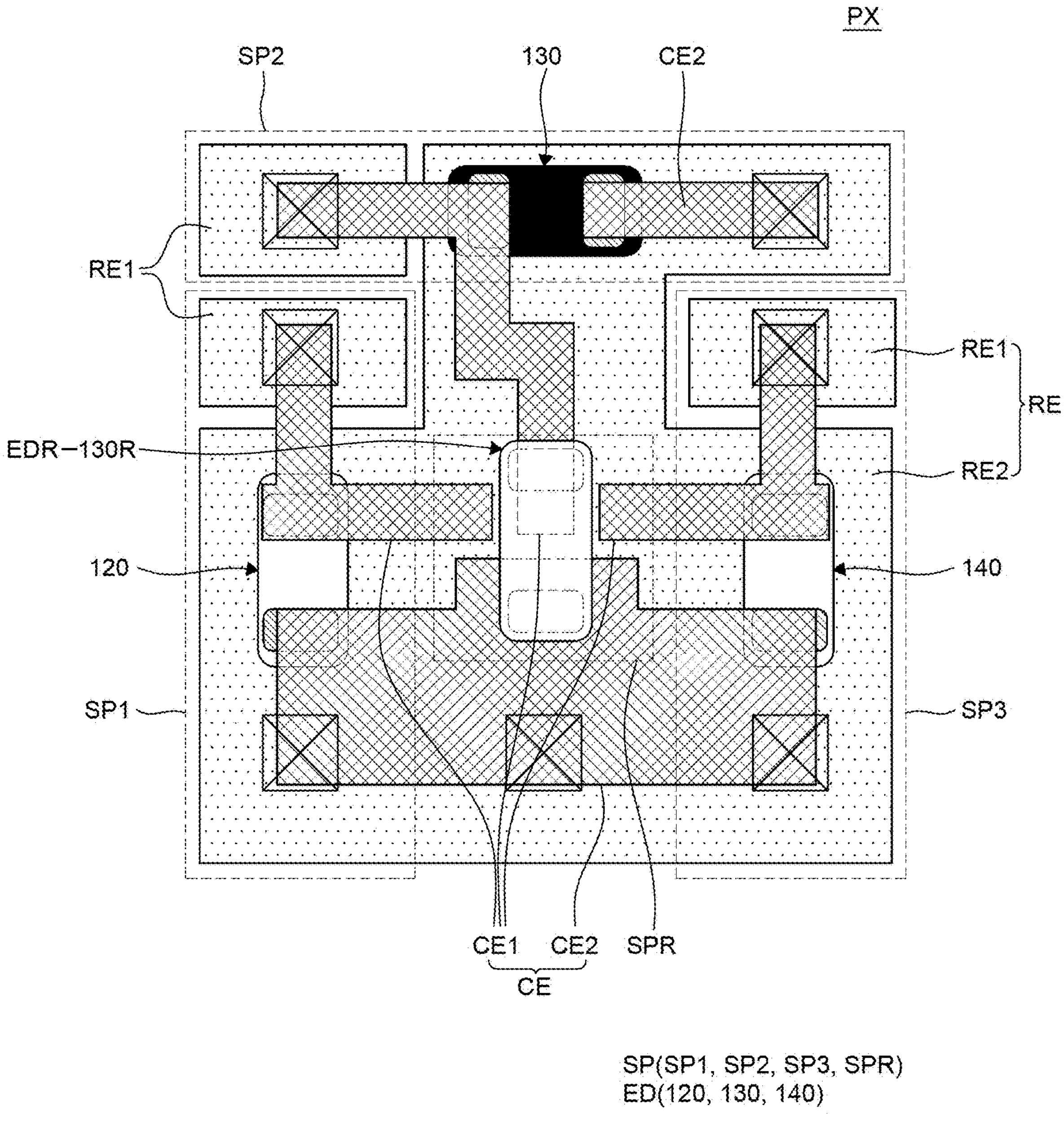
Figure 5C:
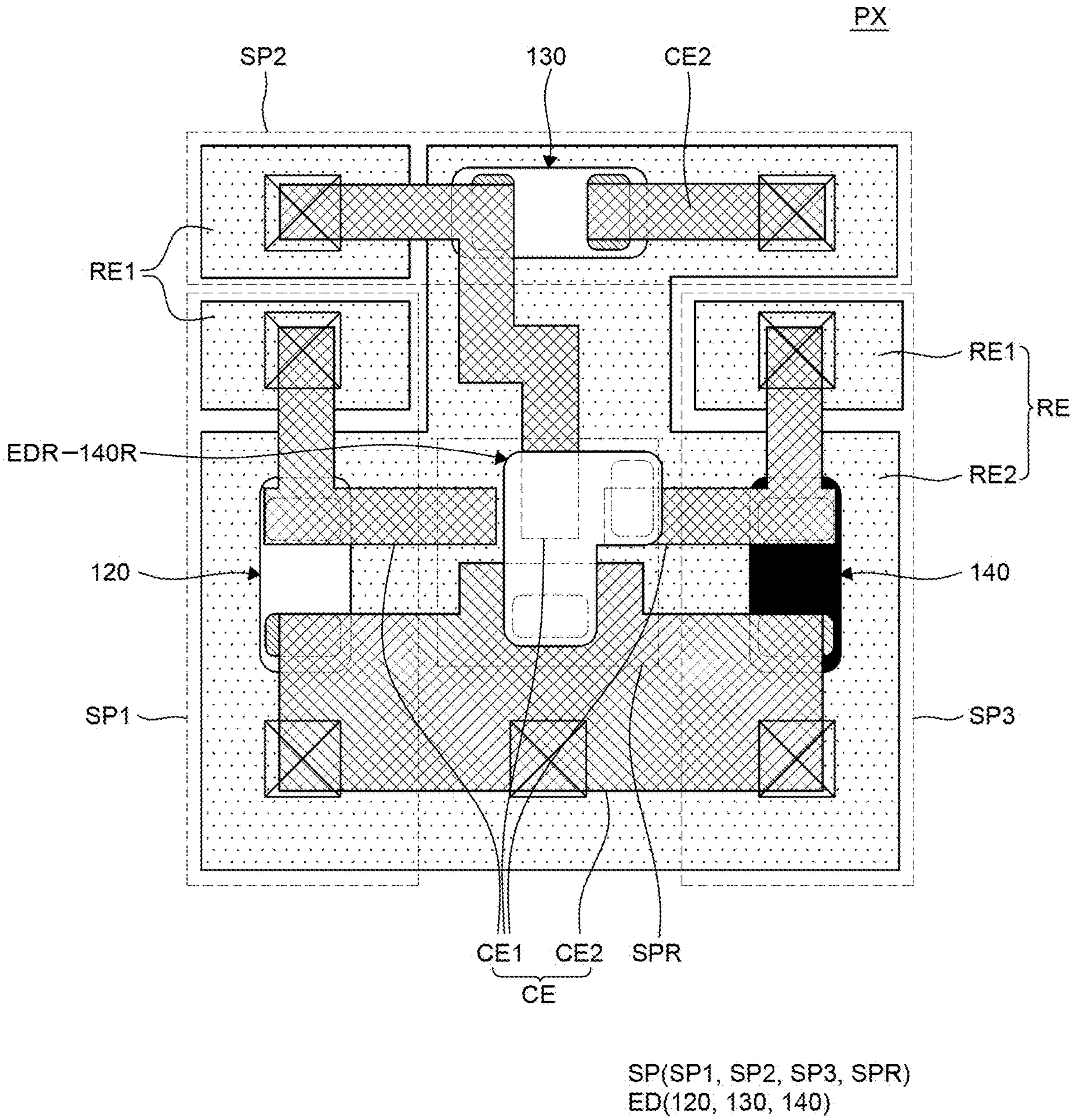
Figure 6:
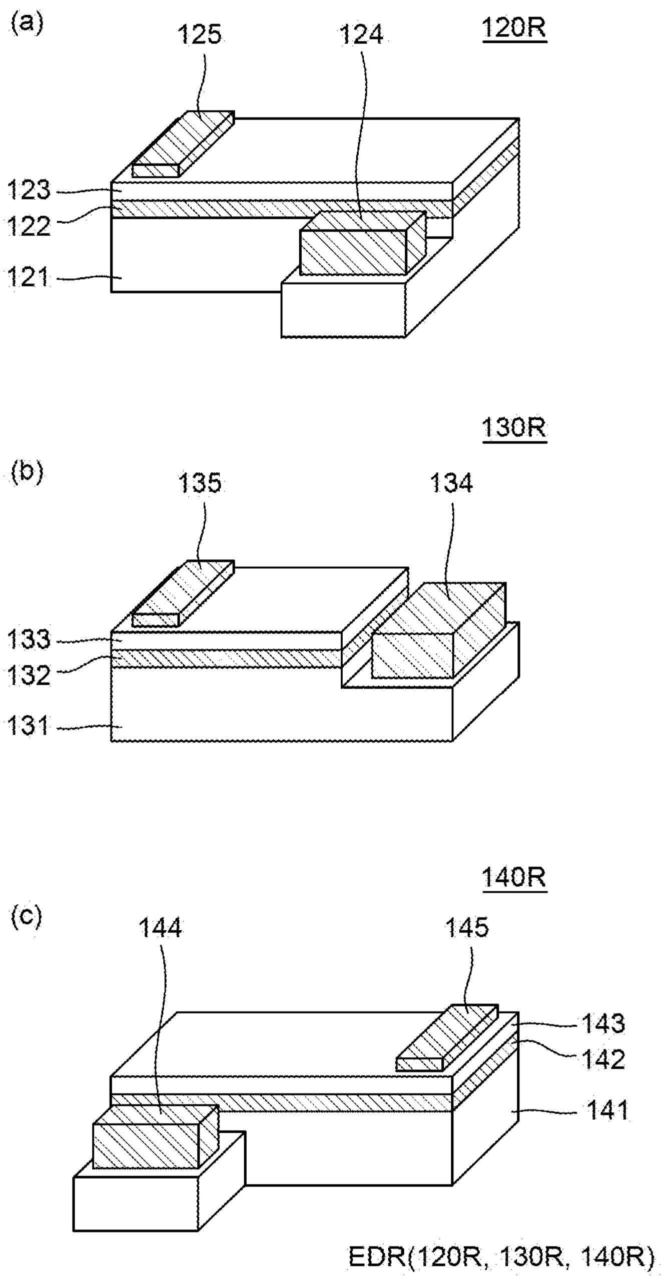
FIG. 6 is a perspective view of a light emitting element of a display device according to an exemplary embodiment of the present disclosure.

FIGS. 4A to 4D are process diagrams for explaining a repair method of a display device according to an exemplary embodiment of the present disclosure. FIGS. 5A to 5C are plan views of a pixel of a display device according to an exemplary embodiment of the present disclosure. FIG. 6 is a perspective view of a light emitting element of a display device according to an exemplary embodiment of the present disclosure. Specifically, FIGS. 4A to 4D are diagrams illustrating the repair method assuming a defect of a first sub pixel SP1, and FIGS. 5A to 5C are plan views of a pixel PX when the first sub pixel SP1, the second sub pixel SP2, and the third sub pixel SP3 are defective, respectively. For convenience of explanation, in FIG. 6, illustration of the protective film of the repair light emitting element EDR is omitted.

It is possible to inspect a lighting defect of the first sub pixel SP1, the second sub pixel SP2, and the third sub pixel SP3. For example, a lighting defect may occur due to a defect of the light emitting element ED itself or a transfer error of the light emitting element ED. When any one sub pixel SP among the first sub pixel SP1, the second sub pixel SP2, and the third sub pixel SP3 is defective, an additional transfer process may be performed on the repair sub pixel SPR to compensate for the defective sub pixel SP. For example, when the first sub pixel SP1 is defective, the first repair light emitting element 120R (shown in FIGS. 4C-4D) may be additionally transferred to the repair sub pixel SPR, and the first repair light emitting element 120R may emit light instead of the first light emitting element 120.

Figure 4A:
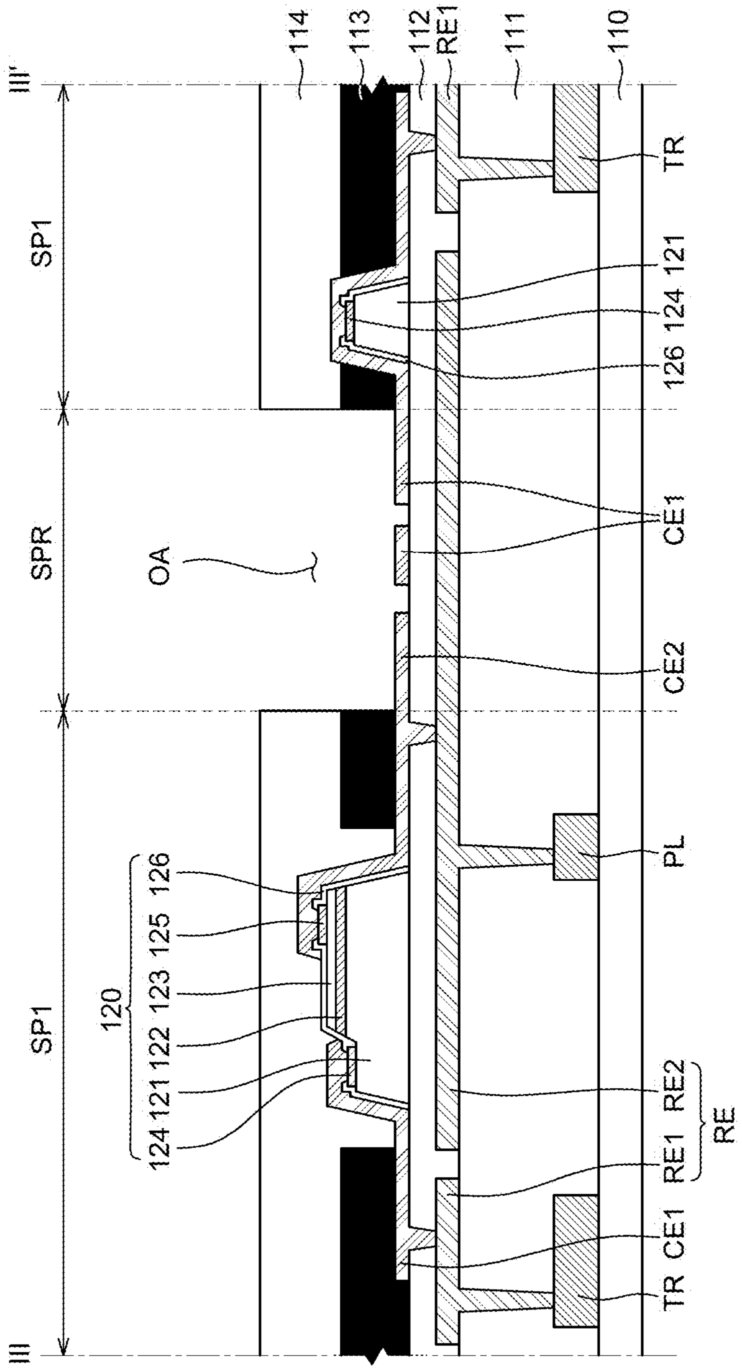
FIGS. 4A to 4D are process diagrams for explaining a repair method of a display device according to an exemplary embodiment of the present disclosure.

Referring to FIG. 4A, when detecting the defective sub pixel SP, an open area OA may be formed in the repair sub pixel SPR. Specifically, the open area OA may be formed by removing the black matrix 113 and the protective layer 114 formed in the repair sub pixel SPR. The black matrix 113 and the protective layer 114 may be partially removed by irradiating a laser or the like onto the repair sub pixel SPR. In the open area OA, a plurality of first connection electrodes CE1 and second connection electrodes CE2 extending from the first sub pixel SP1, the second sub pixel SP2, and the third sub pixel SP3 may be exposed.

Figure 4B:
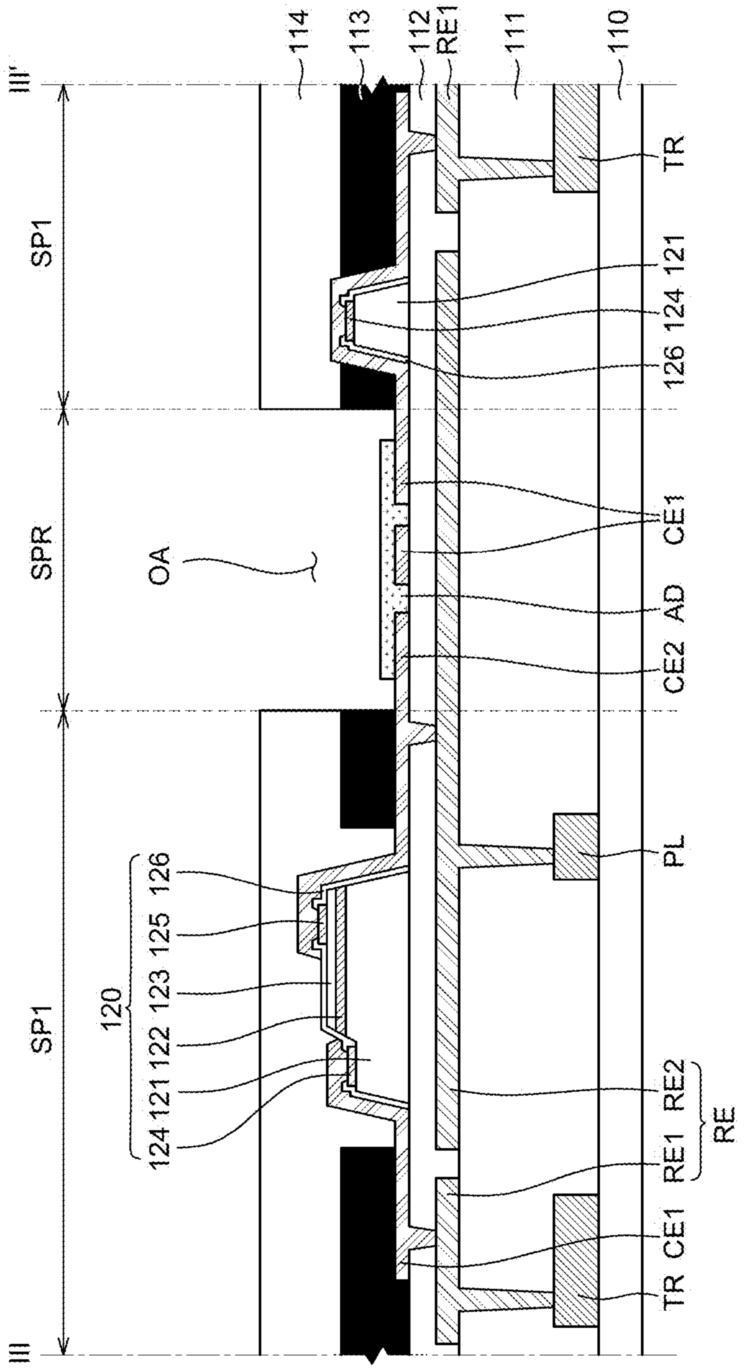

Referring to FIG. 4B, a conductive adhesive layer AD is formed in the repair sub pixel SPR. The conductive adhesive layer AD is formed in an open area OA and may cover a plurality of first connection electrodes CE1 and second connection electrodes CE2 extended from the first sub pixel SP1, the second sub pixel SP2, and the third sub pixel SP3.

The conductive adhesive layer AD may be an adhesive layer 112 in which conductive balls are dispersed in an insulating base member. When heat or pressure is applied to the conductive adhesive layer AD, the conductive balls are electrically connected in portions where heat or pressure is applied to have conductive characteristics, and portions not pressed may have insulating characteristics. Accordingly, a repair light emitting element EDR is transferred onto the conductive adhesive layer AD, and heat or pressure is applied so that the n-type electrode and the p-type electrode of the repair light emitting element EDR may be electrically connected to the first connection electrode CE1 and the second connection electrode CE2, respectively.

Figure 4C:
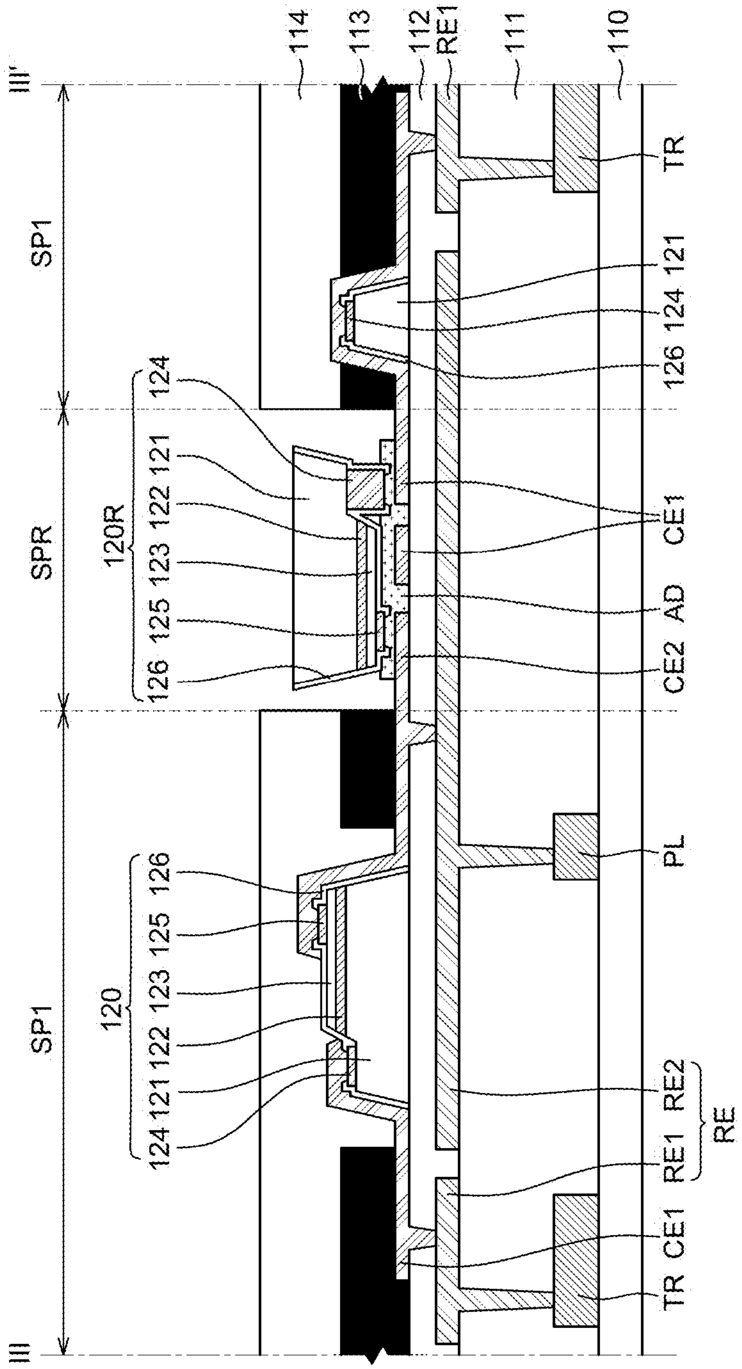

Referring to FIG. 4C, the repair light emitting element EDR is transferred onto the conductive adhesive layer AD. For example, by transferring the repair light emitting element EDR onto the conductive adhesive layer AD and applying heat or pressure, the repair light emitting element EDR may be electrically connected to any one of the plurality of first connection electrodes CE1 extended from the first sub pixel SP1, the second sub pixel SP2, and the third sub pixel SP3, and to the second connection electrode CE2.

The repair light emitting element EDR includes a first repair light emitting element 120R, a second repair light emitting element 130R, and a third repair light emitting element 140R. When the first light emitting element 120 is defective, the first repair light emitting element 120R may be additionally transferred. When the second light emitting element 130 is defective, the second repair light emitting element 130R may be additionally transferred, and when the third light emitting element 140 is defective, the third repair light emitting element 140R may be additionally transferred. The plurality of repair light emitting elements EDR may be configured as flip-chip type chips in which the n-type electrode and the p-type electrode are located on the bottom surface of the light emitting element ED, so as to be connected to the first connection electrode CE1 and the second connection electrode CE2 located below the repair light emitting element EDR.

Meanwhile, the plurality of repair light emitting elements EDR may be formed in various shapes in consideration of the positions of the first connection electrode CE1 and the second connection electrode CE2.

Referring to FIG. 5A and (a) in FIG. 6, when the first light emitting element 120 is defective, a first repair light emitting element 120R may be transferred onto the conductive adhesive layer AD of the repair sub pixel SPR. The first repair light emitting element 120R includes, in the same manner as the first light emitting element 120, a first n-type semiconductor layer 121, a first light emitting layer 122, a first p-type semiconductor layer 123, a first n-type electrode 124, a first p-type electrode 125, and a first protective film 126.

An end of a first connection electrode CE1 extended from the first sub pixel SP1 is disposed in an upper left area of the repair sub pixel SPR, and ends of a second connection electrode CE2 extended from the first sub pixel SP1 and the third sub pixel SP3 may be disposed in a lower area of the repair sub pixel SPR. For example, one end of the first repair light emitting element 120R may be disposed on the second connection electrode CE2 of the lower area of the repair sub pixel SPR, and the other end thereof may be disposed on the first connection electrode CE1 of the upper left area of the repair sub pixel SPR. The first n-type electrode 124 of the first repair light emitting element 120R is located in the upper left area of the repair sub pixel SPR, and the first p-type electrode 125 is disposed to correspond to the lower area of the repair sub pixel SPR, so that it may be electrically connected to the first connection electrode CE1 and the second connection electrode CE2 of the first sub pixel SP1. Accordingly, a planar shape of the first repair light emitting element 120R may be formed in a '˥'-shape.

For example, the first n-type semiconductor layer 121 of the first repair light emitting element 120R may include a bar-shaped portion and a protruding portion extending from the bar-shaped portion. The first light emitting layer 122, the first p-type semiconductor layer 123, and the first p-type electrode 125 may be disposed on the bar-shaped portion of the first n-type semiconductor layer 121. The first n-type electrode 124 may be disposed on the protruding portion of the first n-type semiconductor layer 121.

Referring to FIG. 5B and (b) of FIG. 6, when the second light emitting element 130 is defective, a second repair light emitting element 130R may be transferred onto the conductive adhesive layer AD of the repair sub pixel SPR. The second repair light emitting element 130R includes, in the same manner as the second light emitting element 130, a second n-type semiconductor layer 131, a second light emitting layer 132, a second p-type semiconductor layer 133, a second n-type electrode 134, a second p-type electrode 135, and a second protective film.

An end of a first connection electrode CE1 extended from the second sub pixel SP2 is disposed in an upper central area of the repair sub pixel SPR, and an end of a second connection electrode CE2 extended from an adjacent sub pixel SP may be disposed in a lower area of the repair sub pixel SPR. For example, one end of the second repair light emitting element 130R may be disposed on the second connection electrode CE2 of the lower area of the repair sub pixel SPR, and the other end may be disposed on the first connection electrode CE1 of the upper central area of the repair sub pixel SPR. Accordingly, the second n-type electrode 134 of the second repair light emitting element 130R is located in the upper central area of the repair sub pixel SPR, and the second p-type electrode 135 is disposed to correspond to the lower area of the repair sub pixel SPR, so that it may be electrically connected to the first connection electrode CE1 and the second connection electrode CE2 of the second sub pixel SP2. Accordingly, the planar shape of the second repair light emitting element 130R may be formed in the shape of an 'I'.

For example, the second n-type semiconductor layer 131 of the second repair light emitting element 130R may be formed in a bar shape, and a second light emitting layer 132 and a second p-type semiconductor layer 133, as well as a second n-type electrode 134 and a second p-type electrode 135, may be disposed on the second n-type semiconductor layer 131.

Referring to FIG. 5C and (c) of FIG. 6, when the third light emitting element 140 is defective, a third repair light emitting element 140R may be transferred onto the conductive adhesive layer AD of the repair sub pixel SPR. The third repair light emitting element 140R includes, in the same manner as the third light emitting element 140, a third n-type semiconductor layer 141, a third light emitting layer 142, a third p-type semiconductor layer 143, a third n-type electrode 144, a third p-type electrode 145, and a third protective film.

An end of the first connection electrode CE1 extended from the third sub pixel SP3 may be disposed in the upper right area of the repair sub pixel SPR, and ends of the second connection electrode CE2 extended from the first sub pixel SP1 and the third sub pixel SP3 may be disposed in the lower area of the repair sub pixel SPR. For example, one end of the third repair light emitting element 140R may be disposed on the second connection electrode CE2 of the lower area of the repair sub pixel SPR, and the other end may be disposed on the first connection electrode CE1 of the upper right area of the repair sub pixel SPR. Accordingly, the third n-type electrode 144 of the third repair light emitting element 140R is located in the upper right area of the repair sub pixel SPR, and the third p-type electrode 145 is disposed to correspond to the lower area of the repair sub pixel SPR, so that it may be electrically connected to the first connection electrode CE1 and the second connection electrode CE2 of the third sub pixel SP3. Accordingly, the planar shape of the third repair light emitting element 140R may be formed in the shape of a '⌈'.

For example, the third n-type semiconductor layer 141 of the third repair light emitting element 140R may include a bar-shaped portion and a protruding portion extending from the bar-shaped portion. The third light emitting layer 142, the third p-type semiconductor layer 143, and the third p-type electrode 145 may be disposed on the bar-shaped portion of the third n-type semiconductor layer 141, and the third n-type electrode 144 may be disposed on the protruding portion of the third n-type semiconductor layer 141.

Accordingly, the repair light emitting element EDR may be formed to correspond to the position of the second connection electrode CE2 in the repair sub pixel SPR and the positions of the first connection electrode CE1 extended from each of the first sub pixel SP1, the second sub pixel SP2, and the third sub pixel SP3, so that the repair light emitting element EDR may be electrically connected to the driving transistor TR of the defective sub pixel SP which is to be compensated.

Meanwhile, referring to FIG. 4C and FIGS. 5A to 5C, the repair light emitting element EDR may also overlap the first connection electrode CE1 of another sub pixel SP that is normally driven. For example, the first repair light emitting element 120R may overlap the first connection electrode CE1 extended from the second sub pixel SP2. However, although a conductive adhesive layer AD is disposed between the repair light emitting element EDR and the first connection electrode CE1 of the second sub pixel SP2, a short defect may be suppressed by the first protective film 126. In addition, as described above, the conductive adhesive layer AD has conductive characteristics only in a pressed area, and has insulating characteristics in the other areas. Accordingly, the conductive adhesive layer AD may have conductive characteristics only between the n-type electrode and the p-type electrode of the repair light emitting element EDR and the first connection electrode CE1 and the second connection electrode CE2.

Figure 4D:
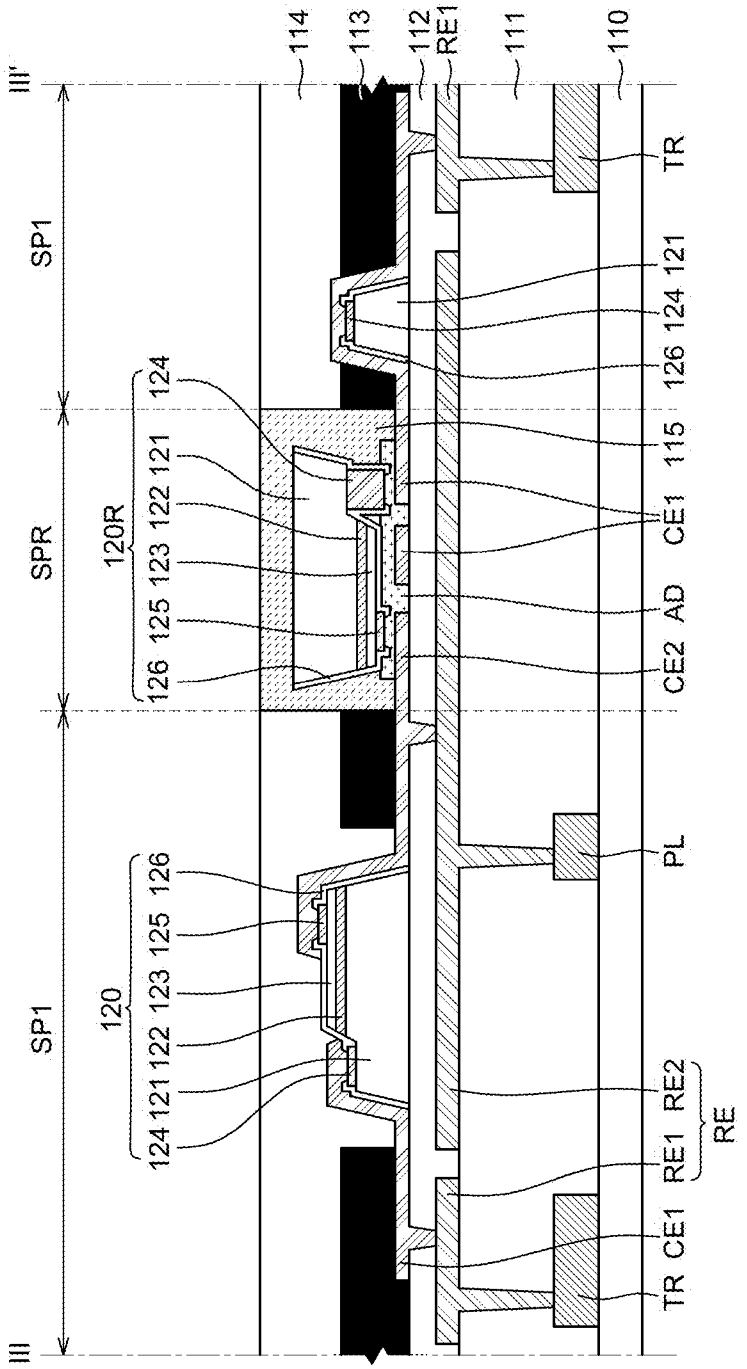

Finally, referring to FIG. 4D, an additional protective layer 115 is filled in the open area OA. The additional protective layer 115 may be filled in the open area OA to cover the repair light emitting element EDR. The additional protective layer 115 may fix and protect the repair light emitting element EDR.

Therefore, in the display device 100 according to an exemplary embodiment of the present disclosure, the repair sub pixel SPR for repairing each of the first sub pixel SP1, the second sub pixel SP2, and the third sub pixel SP3 may be integrated into one repair sub pixel SPR by using repair light emitting elements EDR of various shapes, and thus the area occupied by the repair sub pixel SPR may be reduced.

If a plurality of repair light emitting elements EDR has the same shape, for example, in the form of a general flip chip structure, that is, a rod shape, the first repair light emitting element 120R, the second repair light emitting element 130R, and the third repair light emitting element 140R must secure spacing between a plurality of first connection electrodes CE1 in order to be connected to different first connection electrodes CE1, respectively. The area in which the first repair light emitting element 120R is disposed, the area in which the second repair light emitting element 130R is disposed, and the area in which the third repair light emitting element 140R is disposed must not overlap one another so that the first repair light emitting element 120R, the second repair light emitting element 130R, and the third repair light emitting element 140R may be connected to different first connection electrodes CE1. Accordingly, when a plurality of repair light emitting elements EDR is configured to have the same shape, a separate area for each repair light emitting element EDR must be secured, which may increase the area of the repair sub pixel SPR. In addition, when the repair light emitting elements EDR are present in separate positions by each color, additional processes may be required because, in the process of forming the open area in the repair sub pixel SRP of FIG. 4A, forming the conductive adhesive layer AD of FIG. 4B, and transferring the repair light emitting element EDR of FIG. 4C, the position of the repair light emitting element EDR differs according to each position.

In contrast, in an exemplary embodiment of the present disclosure, a second connection electrode CE2 serving as a common electrode, a first connection electrode CE1 of the first sub pixel SP1, a first connection electrode CE1 of the second sub pixel SP2, and a first connection electrode CE1 of the third sub pixel SP3 may be disposed together in one repair sub pixel SPR. For example, in the repair sub pixel SPR, among the areas on the second connection electrode CE2, the first connection electrode CE1 of the first sub pixel SP1 may be disposed on the left side, the first connection electrode CE1 of the second sub pixel SP2 may be disposed in the center, and the first connection electrode CE1 of the third sub pixel SP3 may be disposed on the right side. In this case, a first repair light emitting element 120R may have a '⌉'-shaped planar shape such that its first n-type electrode 124 corresponds to the first connection electrode CE1 extending from the first sub pixel SP1. Likewise, a second repair light emitting element 130R may have an 'I'-shaped planar shape in order to be connected to the first connection electrode CE1 located at the center, and a third repair light emitting element 140R may have a '⌈'-shaped planar shape in order to be connected to the first connection electrode CE1 located at the right side. In the repair sub pixel SPR, the first connection electrodes CE1 extending from the first sub pixel SP1, the second sub pixel SP2, and the third sub pixel SP3 are disposed together, and each of the plurality of repair light emitting elements EDR may have a shape extending in a different direction from the one second connection electrode CE2 toward each of the plurality of first connection electrodes CE1. Therefore, by using the repair light emitting elements EDR of various shapes corresponding to the positions of the first connection electrodes CE1, even if each of the plurality of repair light emitting elements EDR is disposed at the same position of the repair sub pixel SPR, each of the plurality of repair light emitting elements EDR may be connected to different first connection electrodes CE1. Accordingly, it is unnecessary to separately provide areas in which the plurality of repair light emitting elements EDR is disposed, and a display device 100 capable of displaying a high-resolution image may be implemented by reducing the area of the repair sub pixel SPR.

The exemplary embodiments of the present disclosure can also be described as follows:

According to an first aspect of the present disclosure, a display device includes a substrate on which a plurality of pixels is formed, each pixel including a first sub pixel, a second sub pixel, a third sub pixel, and a repair sub pixel, a first light emitting element disposed in the first sub pixel, a second light emitting element disposed in the second sub pixel, a third light emitting element disposed in the third sub pixel, and a repair light emitting element disposed in the repair sub pixel of at least any one of the plurality of pixels. The repair light emitting element includes a first repair light emitting element, a second repair light emitting element, and a third repair light emitting element having different shapes from each other, and only one of the first repair light emitting element, the second repair light emitting element, and the third repair light emitting element is disposed in one repair sub pixel.

The display device may further include a driving transistor disposed in each of the first sub pixel, the second sub pixel, and the third sub pixel, a power line disposed in each of the plurality of pixels, a first connection electrode connected to the driving transistor of each of the first sub pixel, the second sub pixel, and the third sub pixel, and a second connection electrode disposed in the first sub pixel, the second sub pixel, the third sub pixel, and the repair sub pixel, and connected to the power line, and an end of the first connection electrode of the first sub pixel, an end of the first connection electrode of the second sub pixel, and an end of the first connection electrode of the third sub pixel may be extended to the repair sub pixel.

The second connection electrode may be disposed in a lower area of the repair sub pixel, the first connection electrode extended from the first sub pixel may be disposed in an upper-left area of the repair sub pixel, the first connection electrode extended from the second sub pixel may be disposed in an upper-central area of the repair sub pixel, and the first connection electrode extended from the third sub pixel may be disposed in an upper-right area of the repair sub pixel.

In a pixel among the plurality of pixels in which the first sub pixel is defective, the first repair light emitting element may be disposed in the repair sub pixel, and one end of the first repair light emitting element may be disposed on the second connection electrode, and the other end may be extended toward the first connection electrode extended from the defective first sub pixel to the upper-left area of the repair sub pixel.

In a pixel among the plurality of pixels in which the second sub pixel is defective, the second repair light emitting element may be disposed in the repair sub pixel, and one end of the second repair light emitting element may be disposed on the second connection electrode, and the other end may be extended toward the first connection electrode extended from the defective second sub pixel to the upper-central area of the repair sub pixel.

In a pixel of the plurality of pixels in which the third sub pixel is defective, the third repair light emitting element may be disposed in the repair sub pixel, and one end of the third repair light emitting element may be disposed on the second connection electrode, and the other end may be extended toward the first connection electrode extended from the defective third sub pixel to the upper-right area of the repair sub pixel.

Planar shapes of the first repair light emitting element, the second repair light emitting element, and the third repair light emitting element may be different.

The display device may further include an insulating layer disposed on the driving transistor and the power line, an adhesive layer disposed on the insulating layer, the first light emitting element, the second light emitting element, and the third light emitting element being disposed on a top surface of the adhesive layer, a black matrix disposed on the adhesive layer and having an opening overlapping the first light emitting element, the second light emitting element, and the third light emitting element, and a protective layer disposed on the black matrix, and the first connection electrode and the second connection electrode may be disposed between the adhesive layer and the black matrix and cover each of the first light emitting element, the second light emitting element, and the third light emitting element.

The display device may further include an open area formed in the protective layer and the black matrix in a pixel in which any one of the first sub pixel, the second sub pixel, and the third sub pixel is defective, and a conductive adhesive layer covering the plurality of the first connection electrodes and the second connection electrodes exposed in the open area.

The repair light emitting element may be disposed on the conductive adhesive layer in the open area and may be connected to the first connection electrode and the second connection electrode.

The display device may further include an additional protective layer filled in the open area and covering the repair light emitting element.

The first light emitting element, the second light emitting element, and the third light emitting element may be lateral type light emitting elements, and the repair light emitting element may be a flip-chip type light emitting element.

The conductive adhesive layer may be an adhesive layer in which conductive balls are dispersed in an insulating base member.

The repair light emitting element may be formed to correspond to the position of the second connection electrode in the repair sub pixel and the positions of the first connection electrode extended from each of the first sub pixel, the second sub pixel, and the third sub pixel.

The first repair light emitting element may have a bar-shaped portion and a protruding portion extending from the bar-shaped portion in a first direction, the second repair light emitting element is formed in a bar shape, and the third repair light emitting element has a bar-shaped portion and a protruding portion extending from the bar-shaped portion in a second direction different from the first direction.

According to an second aspect of the present disclosure, a repair method for the display device according to the above aspects of the present disclosure is provided, comprising: inspecting and determining that one of the first sub-pixel, the second sub-pixel, and the third sub-pixel has a lighting defect; forming an opening area in the repair sub-pixel, the opening area exposing a plurality of first connection electrodes and a second connection electrode extending from the first sub-pixel, the second sub-pixel, and the third sub-pixel respectively; forming a conductive adhesive layer in the repair sub-pixel, the conductive adhesive layer covering the plurality of first connection electrodes and the second connection electrode; and transferring the repair light emitting element onto the conductive adhesive layer, the repair light emitting element being electrically connected to a first connection electrode of the one of the first sub-pixel, the second sub-pixel, and the third sub-pixel having the lighting defect, and electrically connected to the second connection electrode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a substrate on which a plurality of pixels is formed, each pixel of the plurality of pixels including a first sub pixel, a second sub pixel, a third sub pixel, and a repair sub pixel;

a first light emitting element disposed in the first sub pixel;

a second light emitting element disposed in the second sub pixel;

a third light emitting element disposed in the third sub pixel;

a repair light emitting element disposed in the repair sub pixel of at least any one of the plurality of pixels;

a driving transistor disposed in each of the first sub pixel, the second sub pixel, and the third sub pixel;

a power line disposed in each of the plurality of pixels;

a first connection electrode connected to the driving transistor of each of the first sub pixel, the second sub pixel, and the third sub pixel; and a second connection electrode disposed in the first sub pixel, the second sub pixel, the third sub pixel, and the repair sub pixel, and connected to the power line, wherein the repair light emitting element includes a first repair light emitting element, a second repair light emitting element, and a third repair light emitting element having different shapes from each other, wherein only one of the first repair light emitting element, the second repair light emitting element, and the third repair light emitting element is disposed in one repair sub pixel of the plurality of pixels, and wherein an end of the first connection electrode of the first sub pixel, an end of the first connection electrode of the second sub pixel, and an end of the first connection electrode of the third sub pixel are extended to the repair sub pixel.

2. The display device according to claim 1, wherein the second connection electrode is disposed in a lower area of the repair sub pixel, and wherein the first connection electrode extended from the first sub pixel is disposed in an upper-left area of the repair sub pixel, the first connection electrode extended from the second sub pixel is disposed in an upper-central area of the repair sub pixel, and the first connection electrode extended from the third sub pixel is disposed in an upper-right area of the repair sub pixel.

3. The display device according to claim 2, wherein in a pixel among the plurality of pixels in which the first sub pixel is defective, the first repair light emitting element is disposed in the repair sub pixel, and wherein one end of the first repair light emitting element is disposed on the second connection electrode, and the other end is extended toward the first connection electrode extended from the defective first sub pixel to the upper-left area of the repair sub pixel.

4. The display device according to claim 2, wherein in a pixel among the plurality of pixels in which the second sub pixel is defective, the second repair light emitting element is disposed in the repair sub pixel, and wherein one end of the second repair light emitting element is disposed on the second connection electrode, and the other end is extended toward the first connection electrode extended from the defective second sub pixel to the upper-central area of the repair sub pixel.

5. The display device according to claim 2, wherein in a pixel of the plurality of pixels in which the third sub pixel is defective, the third repair light emitting element is disposed in the repair sub pixel, and wherein one end of the third repair light emitting element is disposed on the second connection electrode, and the other end is extended toward the first connection electrode extended from the defective third sub pixel to the upper-right area of the repair sub pixel.

6. The display device according to claim 2, wherein planar shapes of the first repair light emitting element, the second repair light emitting element, and the third repair light emitting element are different from each other.

7. The display device according to claim 1, further comprising:

an insulating layer disposed on the driving transistor and the power line;

an adhesive layer disposed on the insulating layer, the first light emitting element, the second light emitting element, and the third light emitting element being disposed on a top surface of the adhesive layer;

a black matrix disposed on the adhesive layer and having an opening overlapping the first light emitting element, the second light emitting element, and the third light emitting element; and a protective layer disposed on the black matrix, wherein the first connection electrode and the second connection electrode are disposed between the adhesive layer and the black matrix and cover each of the first light emitting element, the second light emitting element, and the third light emitting element.

8. The display device according to claim 7, further comprising:

an open area formed in the protective layer and the black matrix in a pixel in which any one of the first sub pixel, the second sub pixel, and the third sub pixel is defective; and a conductive adhesive layer covering the plurality of the first connection electrodes and the second connection electrodes exposed in the open area.

9. The display device according to claim 8, wherein the repair light emitting element is disposed on the conductive adhesive layer in the open area and is connected to the first connection electrode and the second connection electrode.

10. The display device according to claim 9, further comprising:

an additional protective layer present in the open area and covering the repair light emitting element.

11. The display device according to claim 9, wherein the first light emitting element, the second light emitting element, and the third light emitting element are lateral type light emitting elements, and the repair light emitting element is a flip-chip type light emitting element.

12. The display device according to claim 8, wherein the conductive adhesive layer is an adhesive layer in which conductive balls are dispersed in an insulating base member.

13. The display device according to claim 1, wherein the repair light emitting element is formed to correspond to the position of the second connection electrode in the repair sub pixel and the positions of the first connection electrode extended from each of the first sub pixel, the second sub pixel, and the third sub pixel.

14. The display device according to claim 6, wherein the first repair light emitting element has a bar-shaped portion and a protruding portion extending from the bar-shaped portion in a first direction, the second repair light emitting element is formed in a bar shape, and the third repair light emitting element has a bar-shaped portion and a protruding portion extending from the bar-shaped portion in a second direction different from the first direction.

15. A repair method for the display device according to claim 1, comprising:

inspecting and determining that one of the first sub-pixel, the second sub-pixel, and the third sub-pixel has a lighting defect;

forming an opening area in the repair sub-pixel, the opening area exposing a plurality of first connection electrodes and a second connection electrode extending from the first sub-pixel, the second sub-pixel, and the third sub-pixel respectively;

forming a conductive adhesive layer in the repair sub-pixel, the conductive adhesive layer covering the plurality of first connection electrodes and the second connection electrode; and transferring the repair light emitting element onto the conductive adhesive layer, the repair light emitting element being electrically connected to a first connection electrode of the one of the first sub-pixel, the second sub-pixel, and the third sub-pixel having the lighting defect, and electrically connected to the second connection electrode.

* * * * *